United States Patent
Ueta

(10) Patent No.: US 12,364,137 B2
(45) Date of Patent: Jul. 15, 2025

(54) DISPLAY-DEVICE MANUFACTURING METHOD AND DISPLAY DEVICE

(71) Applicant: SHARP KABUSHIKI KAISHA, Sakai (JP)

(72) Inventor: Yoshihiro Ueta, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 548 days.

(21) Appl. No.: 17/783,919

(22) PCT Filed: Dec. 27, 2019

(86) PCT No.: PCT/JP2019/051365
§ 371 (c)(1),
(2) Date: Jun. 9, 2022

(87) PCT Pub. No.: WO2021/131009
PCT Pub. Date: Jul. 1, 2021

(65) Prior Publication Data
US 2023/0006134 A1 Jan. 5, 2023

(51) Int. Cl.
*H10K 59/38* (2023.01)
*H10K 50/115* (2023.01)
*H10K 59/122* (2023.01)
*H10K 71/00* (2023.01)
*H10K 71/13* (2023.01)
*H10K 59/12* (2023.01)

(52) U.S. Cl.
CPC ........... *H10K 59/38* (2023.02); *H10K 50/115* (2023.02); *H10K 59/122* (2023.02); *H10K 71/00* (2023.02); *H10K 71/13* (2023.02); *H10K 59/1201* (2023.02)

(58) Field of Classification Search
CPC .... H10K 59/38; H10K 50/115; H10K 59/122; H10K 71/00; H10K 71/13; H10K 59/1201; G09F 9/00; G09F 9/30; H05B 33/10; H05B 33/12; H05B 33/14; H05B 33/22
See application file for complete search history.

(56) References Cited

U.S. PATENT DOCUMENTS

| 2012/0329342 | A1 | 12/2012 | Sato | |
| 2019/0288044 | A1* | 9/2019 | Hou | H10K 59/1201 |
| 2020/0235186 | A1* | 7/2020 | Jung | H10K 59/126 |
| 2020/0343310 | A1* | 10/2020 | Bae | H10K 59/8792 |
| 2020/0411990 | A1* | 12/2020 | Nakamura | H01Q 21/06 |

FOREIGN PATENT DOCUMENTS

JP 2011198655 A 10/2011

* cited by examiner

*Primary Examiner* — S M Sohel Imtiaz
(74) *Attorney, Agent, or Firm* — ScienBiziP, P.C.

(57) ABSTRACT

A method for manufacturing a display device includes: a step of forming a first recess, in a planarization film, overlapping a first lower electrode; a step of forming a first lower functional layer in the first recess to have a thickness lower than a depth of the first recess; a step of disposing a first screen, which has an opening corresponding to the first recess, on the planarization film, and coating the first lower functional layer with a first light-emitting layer; a step of sliding a squeegee in contact with the first screen to squeegee the first light-emitting layer and, after the squeegeeing, removing the first screen; and a step of sliding the squeegee in contact with the planarization film to squeegee the first light-emitting layer again.

9 Claims, 13 Drawing Sheets

(a)

(b) SHEARING FORCE (c)

(a)

(b)

(a)

(b)

DISPLAY-DEVICE MANUFACTURING METHOD AND DISPLAY DEVICE

TECHNICAL FIELD

The disclosure relates to a method for manufacturing a display device.

BACKGROUND ART

Patent Document 1 discloses a technique to prepare a cryogenically crushed light-emitting-layer material, and to print a light-emitting layer with the prepared material by electrostatic screen printing.

CITATION LIST

Patent Literature

[Patent Document 1] Japanese Unexamined Patent Publication Application No. 2011-198655

SUMMARY OF INVENTION

Technical Problem

A problem of the above technique is that the thickness of the screen is a lower limit of the thickness of the light-emitting layer. Hence, the light-emitting layer cannot be formed thinner than the screen.

Solution to Problem

A method for manufacturing a display device according to an aspect of the disclosure includes: a first step of forming a first recess in a planarization film covering a first lower electrode, the first recess overlapping the first lower electrode; a second step of forming a first lower functional layer in the first recess to have a thickness lower than a depth of the first recess; a third step of disposing a first screen, which has an opening corresponding to the first recess, on the planarization film, and coating the first screen and the first lower functional layer with a first light-emitting layer containing quantum dots; a fourth step of sliding a squeegee in contact with the first screen to squeegee the first light-emitting layer and, after the squeegeeing, removing the first screen; and a fifth step of sliding the squeegee in contact with the planarization film to squeegee the first light-emitting layer again.

Advantageous Effect of Disclosure

An aspect of the present invention disclosure makes it possible to form a first light-emitting layer thinner than a first screen.

DESCRIPTION OF EMBODIMENT

Figure 1:
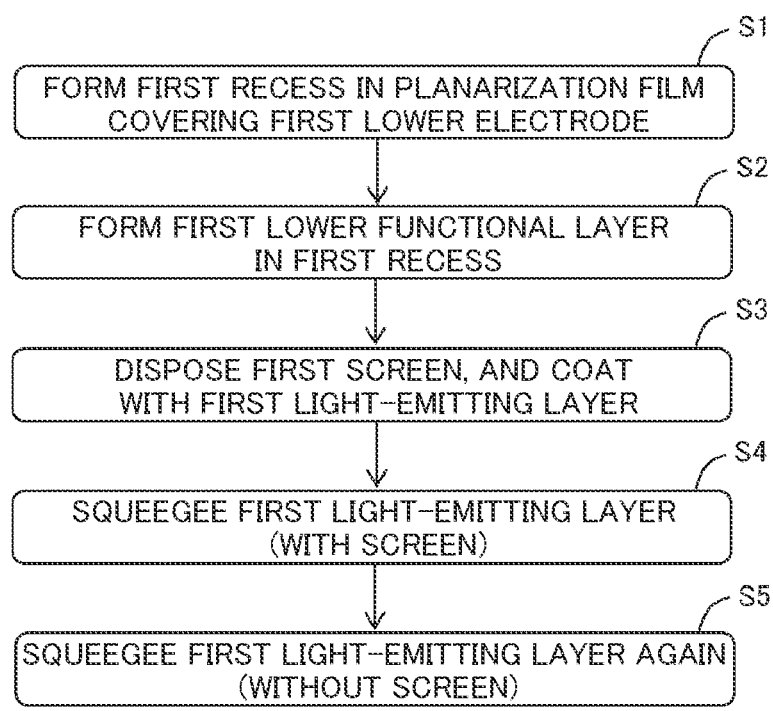
FIG. 1 is a flowchart showing a method for manufacturing a display device according to this embodiment.

FIG. 1 is a flowchart showing a method for manufacturing a display device according to this embodiment. FIG. 2(a) to FIG. 2(e) are cross-sectional views illustrating the method for manufacturing the display device according to this embodiment. FIG. 3(a) to FIG. 3(d) are cross-sectional views illustrating the method for manufacturing the display device according to this embodiment. FIG. 4(a) to FIG. 4(e) are cross-sectional views illustrating the method for manufacturing the display device according to this embodiment.

Figure 2:
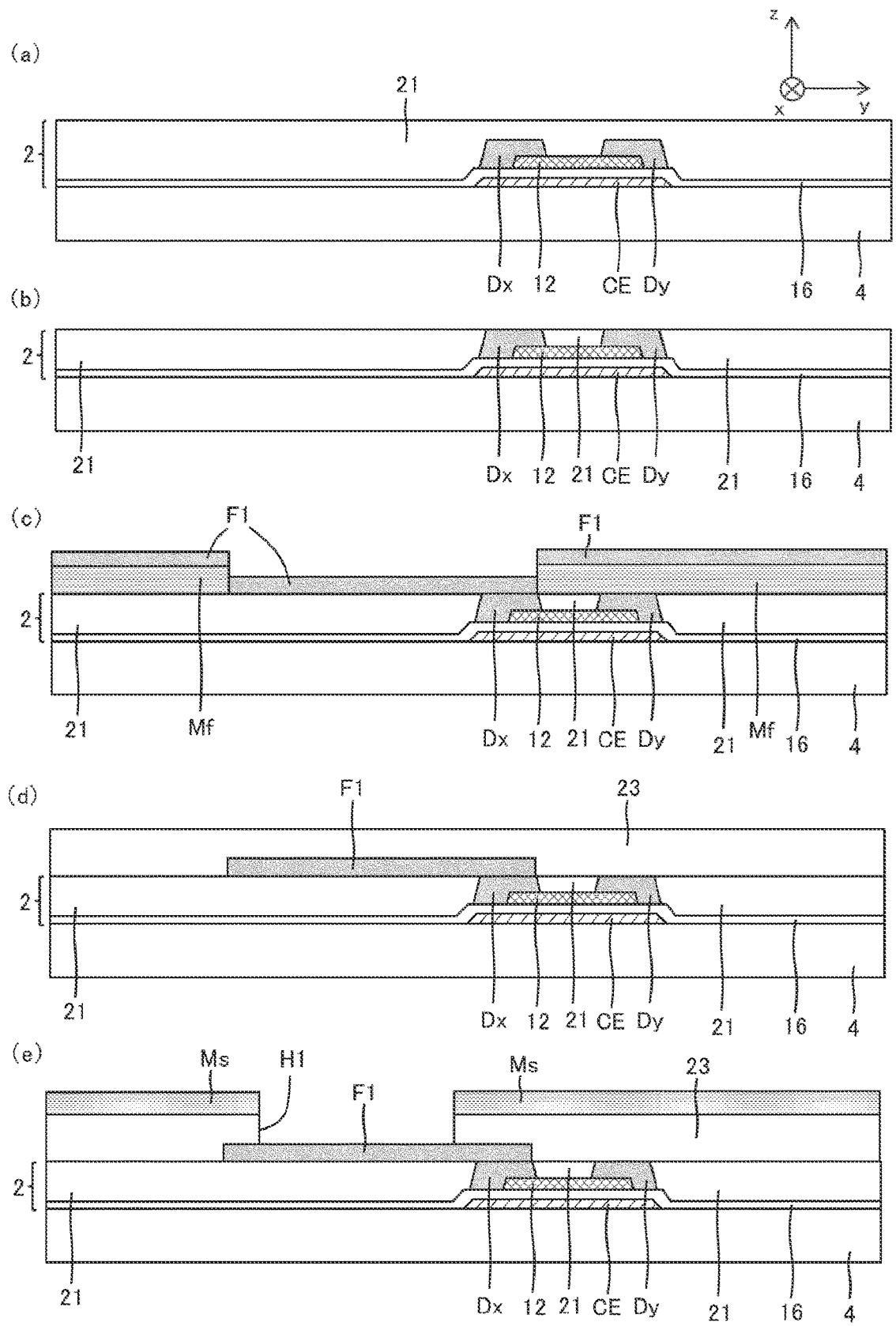
FIG. 2(a) to FIG. 2(e) are cross-sectional views illustrating the method for manufacturing the display device according to this embodiment.

In the method for manufacturing the display device according to this embodiment, a thin-film-transistor layer 2 is formed on a substrate 4 as illustrated in FIG. 2(a). Specifically, on the substrate 4, a control electrode CE, an inorganic insulating film 16, a semiconductor layer 12, conductive electrodes Dx and Dy, and an interlayer insulating film 21 are formed in the stated order. The control electrode CE functions as a gate electrode. The inorganic insulating film 16 functions as a gate insulating film. One of the conductive electrodes Dx and Dy functions as a source electrode, and the other as a drain electrode.

The substrate 4 can be made of either a glass substrate, or a flexible base material containing, as chief component, such a resin as polyimide. The substrate 4 may have an upper face covered with a barrier film (e.g. silicon nitride and silicon oxide) to block such foreign objects as water and oxygen.

Each of the control electrode CE and the conductive electrodes Dx and Dy is a monolayer metal film made of at least one of such metals as, for example, aluminum, tungsten, molybdenum, tantalum, chromium, titanium, and copper. Alternatively, each electrode is a multilayer metal film made of these metals. The inorganic insulating film 16 can be either, for example, a silicon oxide film or a silicon nitride film. Alternatively, the inorganic insulating film 16 can be a multilayer film including these films. The semiconductor layer PS is formed of, for example, oxide semiconductor and low-temperature polysilicon (LIPS). The interlayer insulating film 21 is made of such applicable organic materials as polyimide, acrylic resin, and epoxy resin. Such materials have a planarization effect. These resins may be photosensitive.

After that, as illustrated in FIG. 2(b), the interlayer insulating film 21 undergoes an ashing process, and the conductive electrodes Dx and Dy are exposed.

At Step S1 of FIG. 1 as illustrated in FIG. 2(c), a metal mask Mf is disposed in contact with the interlayer insulating film 21, in order to expose the conductive electrode Dx and shield the conductive electrode Dy. A first lower electrode F1 is formed by such techniques as sputtering, vapor deposition, and coating. The first lower electrode F1, which reflects light, is a multilayer stack of, for example, indium tin oxide (ITO) and either silver (Ag) or an alloy containing Ag. The first lower electrode F1 may be made of such materials as IZO, Al, and Mg. After the first lower electrode F1 is deposited, the metal mask Mf is removed. Note that, instead of disposing the metal mask Mf, a resist pattern may be formed by photolithography.

After that, as illustrated in FIG. 2(d), a planarization film 23 is deposited to cover the first lower electrode F1. The planarization film 23 can be made of, for example, applicable organic materials such as polyimide, acrylic resin, and epoxy resin. The thickness of the planarization film 23 on the first lower electrode F1 is equal to the sum of the thicknesses of a first lower functional layer and a first light-emitting layer to be described later.

At Step S1 of FIG. 1 as illustrated in FIG. 2(e), the planarization film 23 undergoes an ashing process using a metal mask Ms, and a recess H1 is formed to overlap the first lower electrode F1. The ashing process is carried out until the first lower electrode F1 is exposed. Hence, an edge portion of the first lower electrode F1 is covered with the planarization film 23, and a non-edge portion of the first lower electrode F1 is exposed. In FIG. 2(e), the recess H1 does not overlap a channel portion of the semiconductor layer 12 because planarization is important. However, the recess H1 shall not be limited to such a configuration. For example, if high definition is requested, the first lower electrode F1 and the recess H1 may overlap the channel portion of the semiconductor layer 12.

Figure 3:
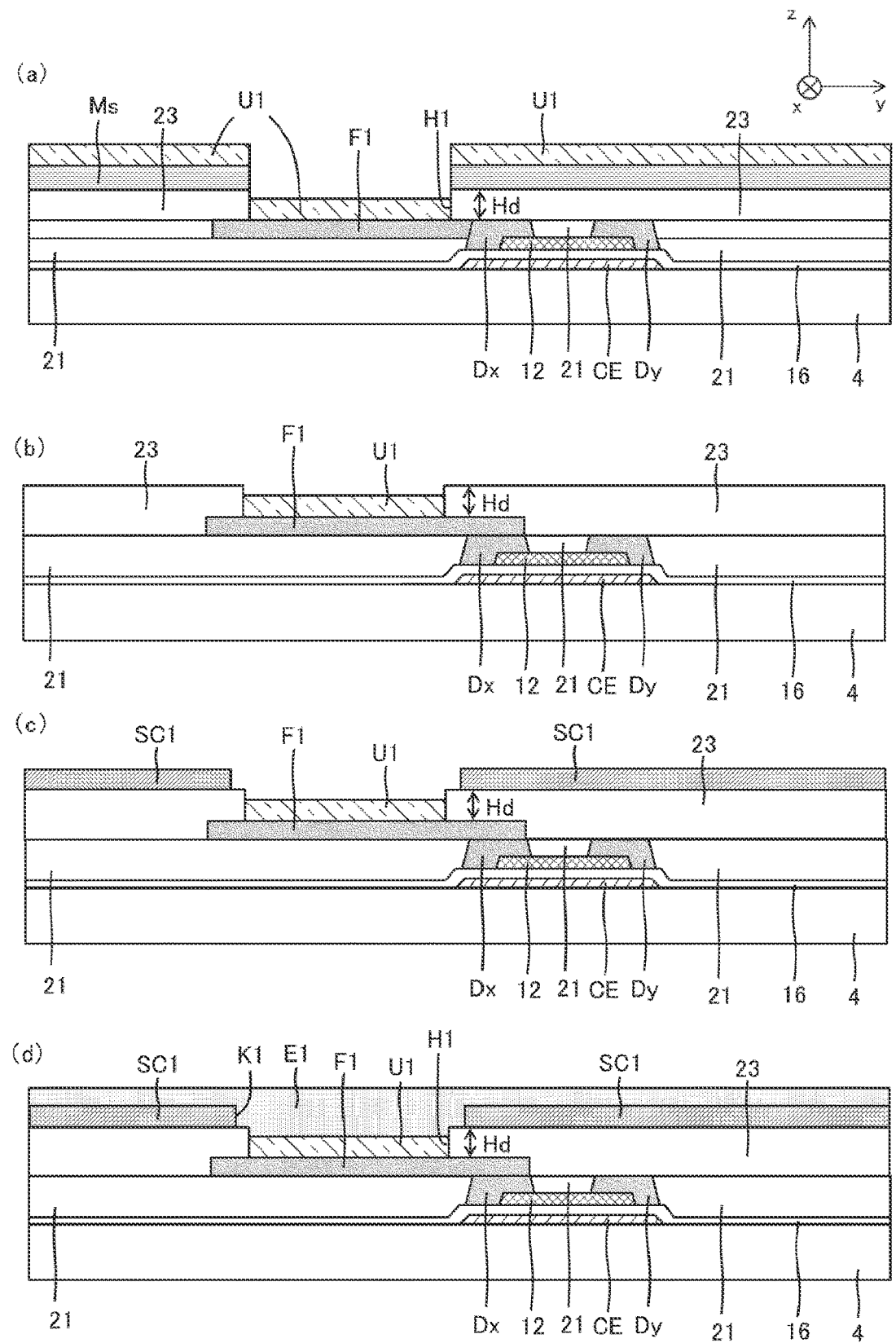
FIG. 3(a) to FIG. 3(d) are cross-sectional views illustrating the method for manufacturing the display device according to this embodiment.

At Step S2 of FIG. 1 as illustrated in FIG. 3(a), while the metal mask Ms is disposed, a first lower functional layer U1 is formed in the first recess H1 to have a thickness lower than a depth Hd of the first recess H1. The first lower functional layer U1 can be formed by such techniques as sputtering, vapor deposition, and coating.

The first lower functional layer U1 includes at least a carrier transport layer. Examples of materials to form the carrier transport layer as a hole-transport layer include: such oxides as Cr, Ni, Mg, Mo, W, and La; a II-VI semiconductor compound that is p-type doped or a III-V semiconductor compound that is p-type doped; and an inorganic substance or an organic substance that transports holes. Examples of materials to form the carrier transport layer as an electron-transport layer include ZnO, MgO, ZnMgO, $TiO_2$, $MoO_3$, $WO_3$, and a II-VI semiconductor compound that is n-type doped, or a III-V semiconductor compound that is n-type doped. Note that the electron-transport layer has a thickness of preferably 200 nm or less. This is because if the thickness exceeds 200 nm, a series resistance component becomes too large to ignore.

The first lower functional layer U1 may include a carrier injection layer in addition to the carrier transport layer. A work function of the carrier injection layer is preferably greater than, or equal to, a work function of the first lower electrode F1. The work function (or an ionization potential) of the carrier injection layer is smaller than, or equal to, an ionization potential of the carrier transport layer. Such a carrier injection layer allows efficient injection of carriers from the first lower electrode F1 into the carrier transport layer. Note that, instead of disposing the metal mask Ms, a resist pattern may be formed by photolithography.

Then, as illustrated in FIG. 3(b), after the first lower electrode F1 is deposited, the metal mask Ms is removed. A step height between an upper face of the planarization film 23 and an upper face of the first lower functional layer U1 defines a thickness of a first light-emitting layer to be described later. This step height is determined by the depth Hd of the first recess H1 and the thickness of the first lower functional layer U1. The depth Hd of the first recess H1 can be controlled by a time period of the ashing process that the planarization film 23 undergoes. The thickness of the first lower functional layer U1 can be controlled highly precisely by a deposition condition or a deposition rate. If the first lower functional layer U1 is deposited by, for example, sputtering, a deposition rate of approximately 20 nm/20 min can be easily achieved. When the deposition rate is controlled by seconds, the thickness of the layer can be controlled on the order of 0.1 nm without introducing a special technique.

At Step S3 of FIG. 1 as illustrated in FIG. 3(c) and FIG. 3(d), a first screen SC1, which has an opening K1 corresponding to the first recess H1, is disposed in contact with the planarization film 23 so that the opening K1 overlaps the first recess. The first screen SC1 and the first lower functional layer U1 are coated with an ink containing quantum dots (a first light-emitting layer E1 in liquid form). Hence, a remaining portion of the first recess H1 (a portion without the first lower functional layer U1) and the opening K1 are filled with the ink (the first light-emitting layer E1 in liquid form).

The opening K1 of the first screen SC1 is sized to preferably contain therein the first recess H1 in plan view. If the opening K1 is as large as the first recess H1, the ink might be scraped out of the first recess H1 in a squeegeeing process that follows. This problem occurs because, when the squeegee moves, stress concentrates on an end portion of the opening K1 of the first screen SC1. The problem can be solved when the opening K1 where the stress concentrates is separated from the first recess H1.

Figure 4:
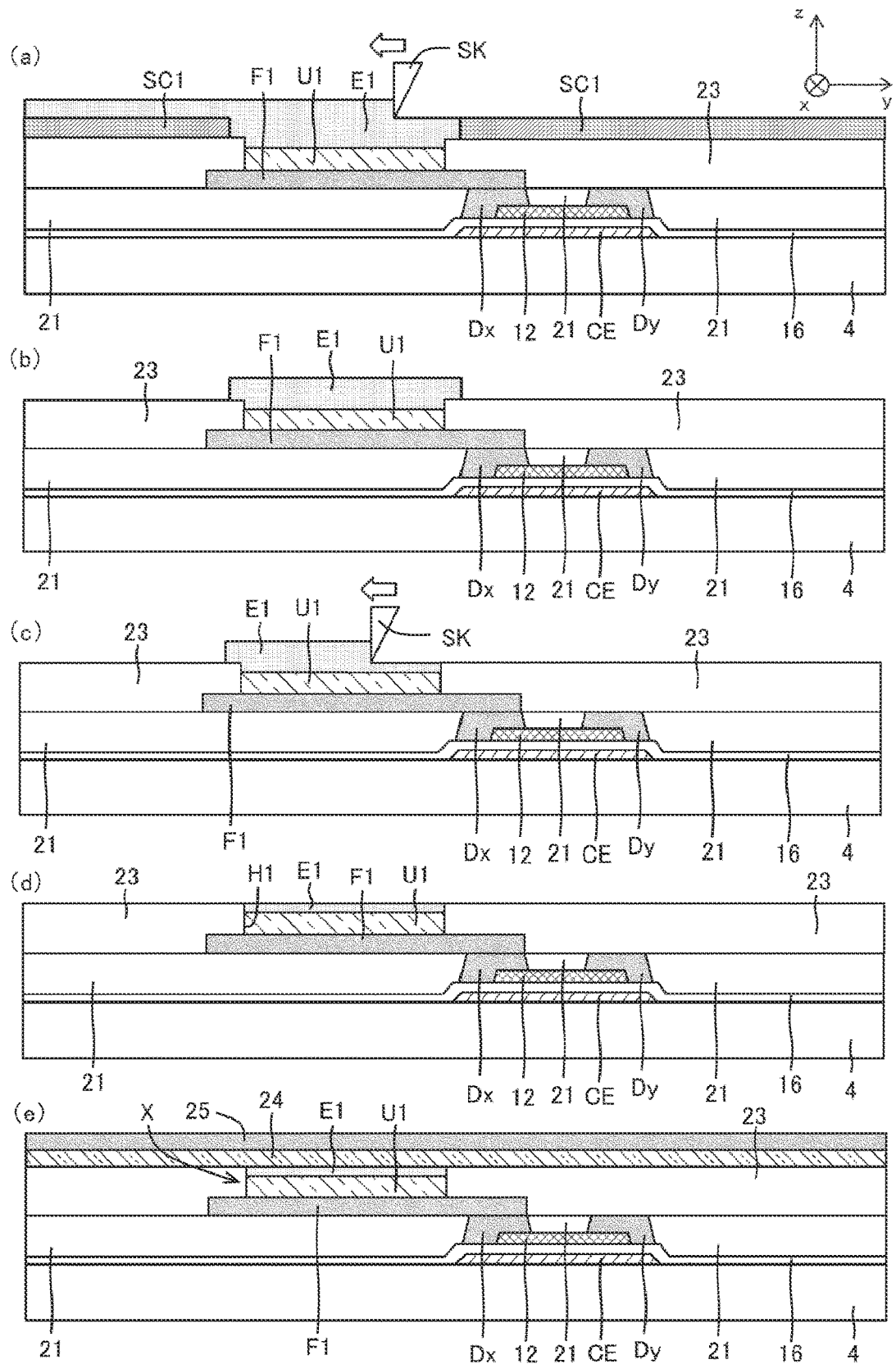
FIG. 4(a) to FIG. 4(e) are cross-sectional views illustrating the method for manufacturing the display device according to this embodiment.

After that, as illustrated in FIG. 4(a), a squeegee SK is slid in contact with the first screen SC1 to squeegee the ink (the first light-emitting layer E1). Hence, the ink in the opening of the first screen SC1 stays, while the ink on the top of the first screen is removed. After the squeegeeing, the first screen SC1 is removed as illustrated in FIG. 4(b).

The ink is made of a solvent in which the quantum dots are dispersed. Thus, when the squeegee SK strokes the first screen SC1, the ink might be removed by dilatancy. To prevent the ink from being removed, a particle volume concentration; that is, a proportion of the total volume of the quantum dots contained in the ink per unit volume, is desirably 45% or less, a viscosity of the ink is preferably 500 Pa·sec or below, and a speed of the stroke is preferably 10 m/sec or slower.

Figure 5:
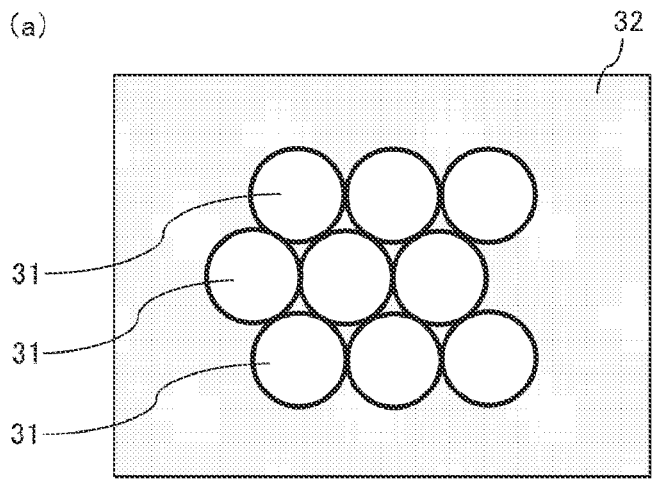
FIG. 5(a) to FIG. 5(c) schematically show how dilatancy works.
Figure 5:
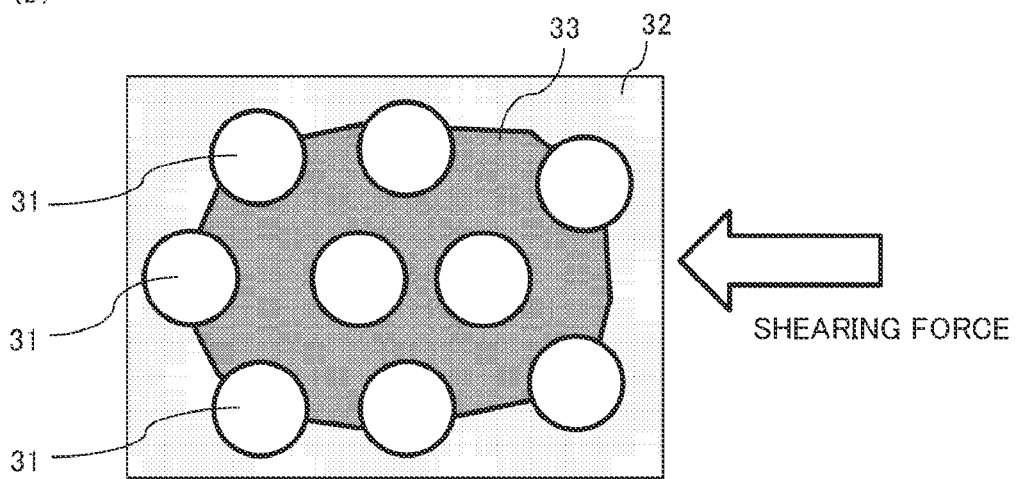
Figure 5:
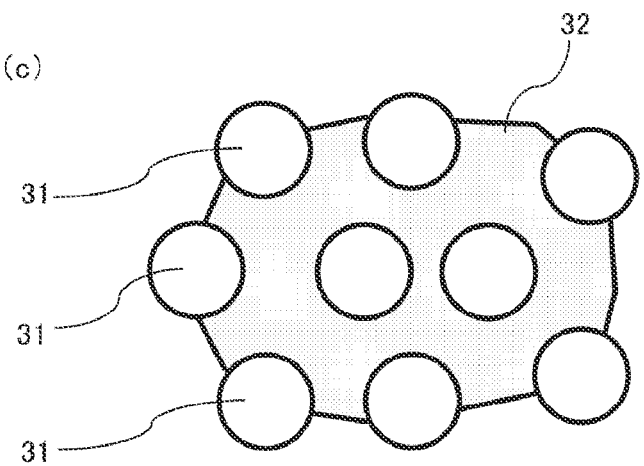
Figure 6:
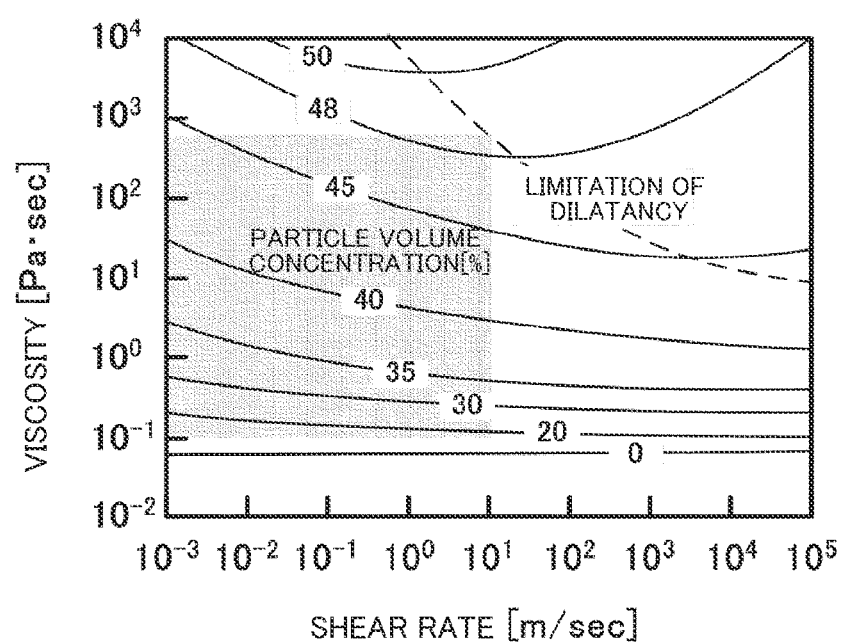
FIG. 6 is a graph illustrating a relationship between shear rate and viscosity.

FIG. 5(a) to FIG. 5(c) schematically show how dilatancy works for the ink containing quantum dots 31. FIG. 6 is a graph illustrating a relationship between shear rate and ink viscosity. FIG. 5(a) illustrates a state of the ink applied to the screen. The ink includes a solvent 32 containing the quantum dots 31. When the squeegee strokes the screen, shearing force acts on the ink. Hence, the quantum dots 31 move away, and are immediately spaced apart, from one another.

Hence, as illustrated in FIG. 5(b), the increasing space between the quantum dots 31 leaves a region 33 creating a negative pressure among the quantum dots 31. Because of the negative pressure among the quantum dots 31, the solvent 32 around the quantum dots 31 is sucked into the space between the quantum dots 31. Accordingly, the ink loses its fluidity. When the ink loses its fluidity and becomes adhesive, the ink forms a lump. Hence, the light-emitting layer is delaminated. As illustrated in FIG. 6, a limitation of the dilatancy depends on the ink viscosity, the particle volume concentration, and the shear rate. As long as the limitation of the dilatancy is within the area of the hatching, the delamination of the light-emitting layer can be mostly prevented.

Note that a degree of the adhesiveness varies depending on the particle volume concentration of the ink. The ink is fused with the printing surface by an anchor effect due to microtexturing on the printing surface, and by electrostatic adsorption due to the van der Waals force. If the particle volume concentration of the ink is small, the fusion strength is greater than the adhesiveness.

After that, as illustrated in FIG. 4(c), the squeegee SK is slid in contact with the planarization film 23 to squeegee the first light-emitting layer E1 again. Here, a region where no first light-emitting layer E1 is found is all flat, and the squeegee can stroke as does so on the screen. Hence, as illustrated in FIG. 4(d), a portion of the first light-emitting layer E1 remains in the first recess H1, and the rest of the first light-emitting layer E1 is removed. Such a feature makes it possible to form the first light-emitting layer E1 thinner than the first screen SC1.

After that, as illustrated in FIG. 4(e), a first upper functional layer J1 and an upper electrode (a common electrode) 25 are formed above the first light-emitting layer E1 in the stated order. Hence, a light-emitting element X is formed to include the first lower electrode F1, the first lower functional layer U1, the first light-emitting layer E1, the first upper functional layer J1, and the upper electrode 25. The upper electrode 25 is a metal thin film made of, for example, an alloy of magnesium and silver, and is transparent to light.

The light-emitting element X is a quantum-dot light-emitting diode (QLED) including the first light-emitting layer E1 containing quantum dots. Holes and electrons recombine together in the first light-emitting layer E1 by a drive current between the first lower electrode F1 and the upper electrode 25, which forms an excitors. While the excitors transforms from the conduction band level to the valence band level of the quantum dots, light is released. Note that the first lower electrode F1 may act as an anode. The upper electrode 25 may act as a cathode. The first lower functional layer U1 may be made of a material at least transporting the holes. The first lower electrode F1 may act as a cathode. The upper electrode 25 may act as an anode. The first lower functional layer U1 may be made of a material at least transporting the electrons.

In this embodiment, the depth Hd of the first recess formed in the planarization film 23 and the film thickness of the first lower functional layer U1 can define the thickness of the first light-emitting layer E1. Such a feature makes it possible to form the light-emitting layer thinner than the screen, which has been impossible by screen printing.

The thickness of the screen is limited by mechanical strength required for printing, materials, and pixel sizes. Hence, the screen cannot be as thin as, or thinner than, approximately 500 µm. Hence, a known screen printing technique cannot form a light-emitting layer thinner than approximately 500 µm. If the light-emitting layer has a thickness of approximately 500 µm, carriers to be injected are neither uniform nor highly dense across the thickness. Consequently, the light emission efficiency cannot increase.

Moreover, this embodiment eliminates the need of a vacuuming process to be used for a known light-emitting element manufacturing method. Such a feature can reduce the costs of, and the time for, manufacturing a light-emitting element.

Furthermore, the ink removed by the squeegeeing is recovered and reused. Such a feature makes it possible to use an expensive light-emitting material economically and efficiently. In addition, the surface of the first screen SC1 is provided with liquid repellent finishing. Such a feature can increase efficiency in recovery of the ink. A technique to provide the liquid repellent finishing may involve, for example, processing the surface of the first screen SC1 with fluorine to decrease chemical activity. Note that the first screen SC1 can also be reused.

Figure 7:
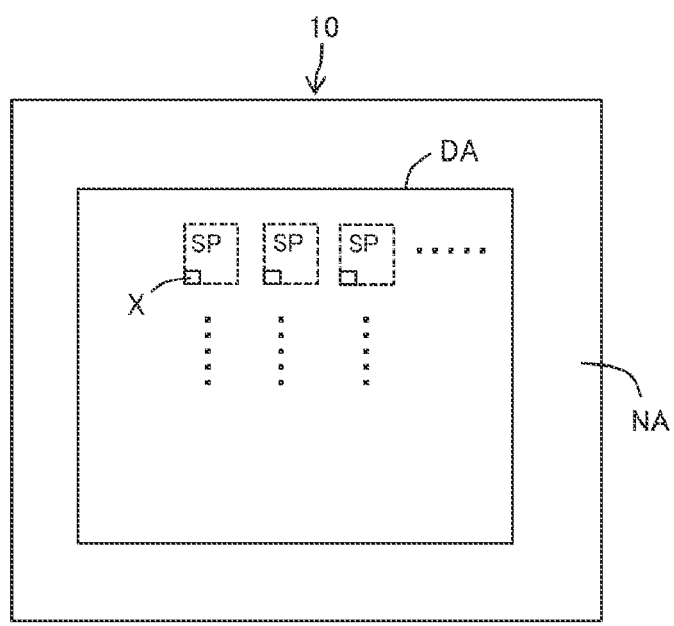
FIG. 7(a) is a plan view of the display device according to this embodiment.
FIG. 7(b) is a cross-sectional view of the display device according to this embodiment.
Figure 7:
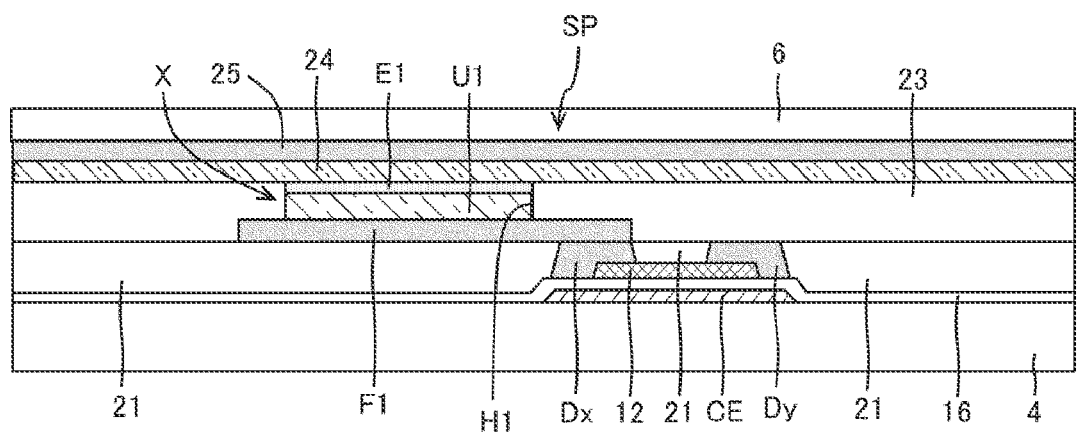

FIG. 7(a) is a plan view of the display device according to this embodiment. FIG. 7(b) is a cross-sectional view of the display device according to this embodiment. As illustrated in FIG. 7(a), a display device 10 includes: a display region DA; and a frame region NA. The display region DA includes a plurality of sub-pixels SP. Each of the sub-pixels includes the light-emitting element X. As illustrated in FIG. 7(b), in the sub-pixel SP, the first lower electrode F1 is formed on the interlayer insulating film 21. In the planarization film 23, the first recess H1 is formed to overlap the first lower electrode F1. In the first recess H1, the first lower functional layer U1 and the first light-emitting layer E1 containing quantum dots are stacked together. The upper face of the planarization film 23 is flush with an upper face of the first light-emitting layer E1. A state in which a plurality of faces are flush with one another means that the faces continue flat without gaps. The state may allow a variation of plus or minus 2 nm between the upper face of the planarization film 23 and the position of the first light-emitting layer E1. The variation is approximately an average radius of the quantum dots contained in the first light-emitting layer E1.

In plan view, an outer edge of the first lower functional layer U1, an outer edge of the first light-emitting layer E1, and an outer edge of the first recess H1 match with one another. The planarization film 23 is an edge cover. A peripheral end portion (an edge) of the first lower electrode F1 is covered with the planarization film 23. A non-peripheral end portion of the first lower electrode F1 is in contact with the first lower functional layer U1.

Formed above the first light-emitting layer E1 are an upper functional layer 24 and the upper electrode (the common electrode) 25. A sealing layer 6 is formed to cover the upper electrode 25. The sealing layer 6 keeps such foreign objects as water and oxygen from the light-emitting element X. For example, the sealing layer 6 can include two inorganic sealing films and an organic film formed between the two inorganic sealing films.

In the light-emitting element X, the first lower electrode F1 may be an anode. The upper electrode 25 may be a cathode. The first lower functional layer U1 may at least transport the holes. The first upper functional layer J1 may at least transport the electrons.

Moreover, in the light-emitting element X, the first lower electrode F1 as the anode, the hole-transport layer, the light-emitting layer, the electron-transport layer, and the cathode are stacked on top of another in the stated order. In another embodiment, however, the stacking order of the layers shall not be limited to the above order. That is, in the light-emitting element of another embodiment, the first lower electrode F1 may be the cathode. The upper electrode 25 may be the anode. The first lower functional layer U1 may at least transport the electrons. The first upper functional layer J1 may at least transport the holes.

EXAMPLE 1

Figure 8:
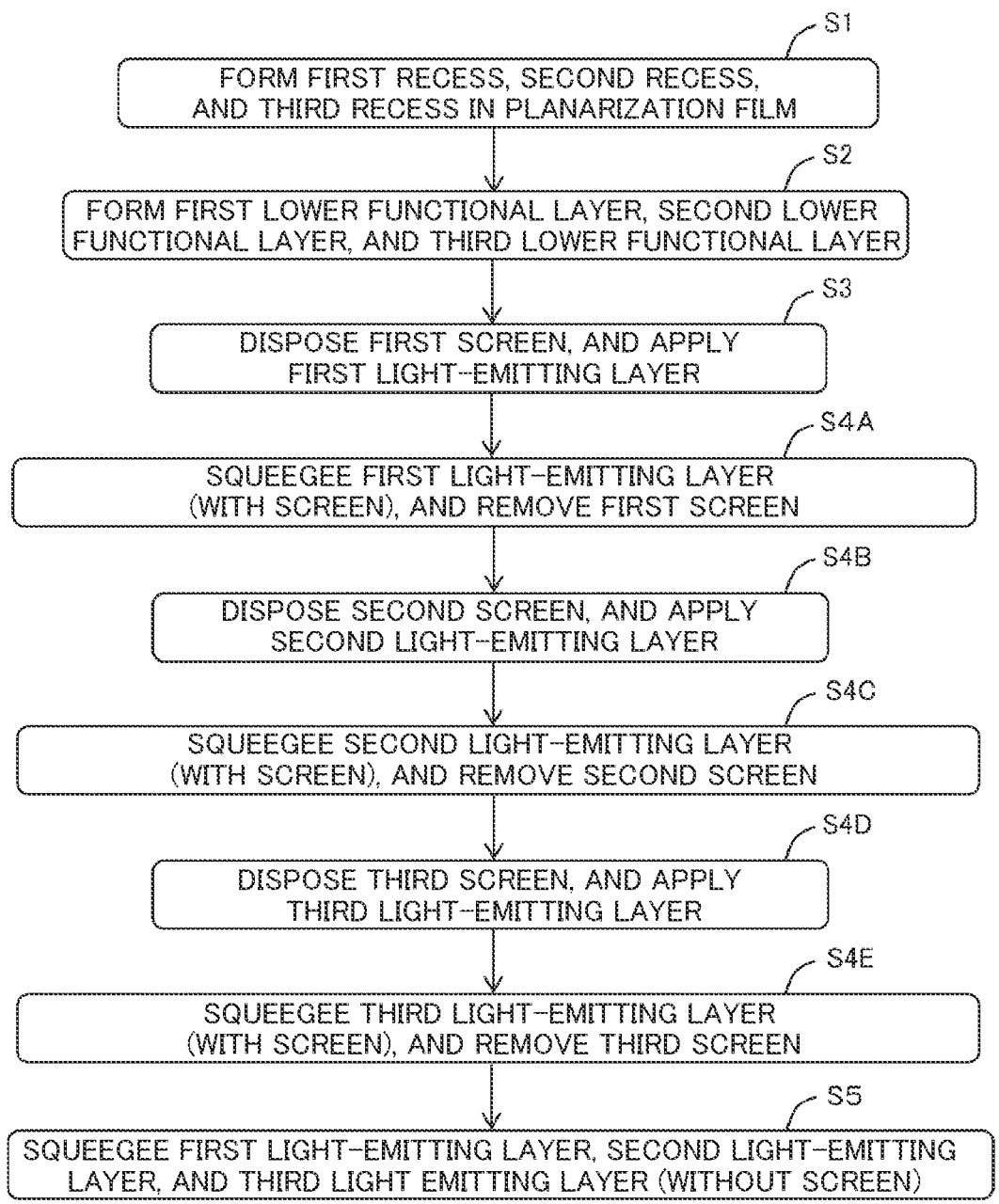
FIG. 8 is a flowchart showing a method for manufacturing the display device according to Example 1.
Figure 9:
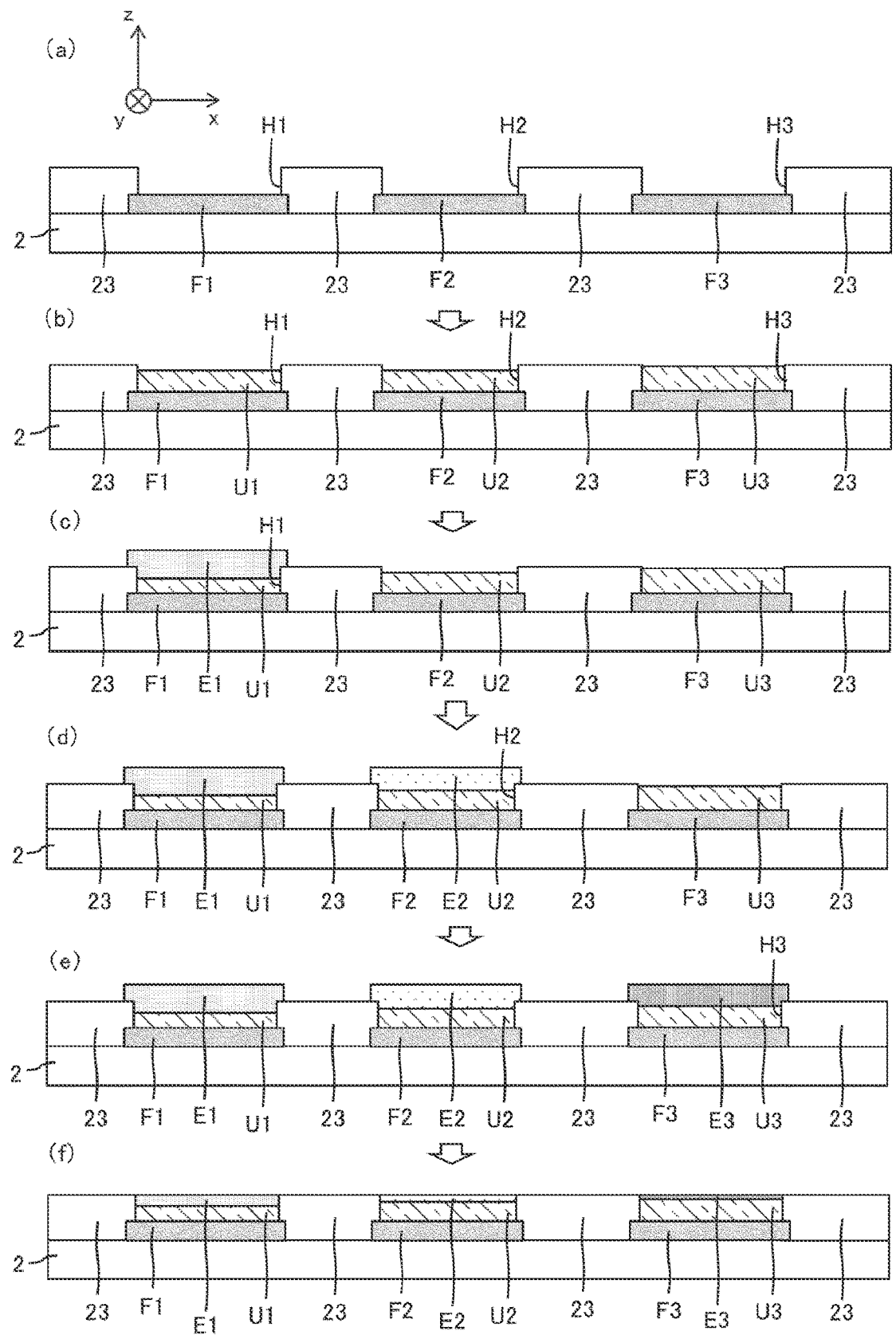
FIG. 9(a) to FIG. 9(f) are cross-sectional views illustrating the method for manufacturing the display device according to Example 1.

FIG. 8 is a flowchart showing a method for manufacturing the display device according to Example 1. FIG. 9(a) to FIG. 9(f) are cross-sectional views illustrating the method for manufacturing the display device according to Example 1. FIG. 10(a) to FIG. 10(d) are cross-sectional views illustrating the method for manufacturing the display device according to Example 1. In Example 1, at Step S1 of FIG. 8 as illustrated in FIG. 9(a), formed in the thin-film transistor 2 and arranged in an x-direction (in a row direction) are the first lower electrode F1, a second lower electrode F2, a third lower electrode F3, and the planarization film 23 covering these lower electrodes. After that, formed in the planarization film 23 are the first recess H1 overlapping the first lower electrode F1, a second recess H2 overlapping the second lower electrode F2, and a third recess H3 overlapping the third lower electrode F3.

Note that a plurality of the first recesses H1 are arranged in a y-direction (a column direction). A plurality of the second recesses H2 are arranged in the y-direction. A plurality of the third recesses H3 are arranged in the y-direction. The first recesses H1, the second recesses H2, and the third recesses H3 are arranged in the x-direction (the row direction).

At Step S2 of FIG. 8 as illustrated in FIG. 9(b), the first lower functional layer U1 is formed in each first recess H1 to have a thickness lower than a depth of the first recess H1. A second lower functional layer U2 is formed in each second recess H2 to have a thickness lower than a depth of the second recess H2. A third lower functional layer U3 is formed in each third recess H3 to have a thickness lower than a depth of the third recess H3. The first lower functional layer U1, the second lower functional layer U2, and the third lower functional layer U3 may be formed of either different materials, or a common material.

Figure 10:
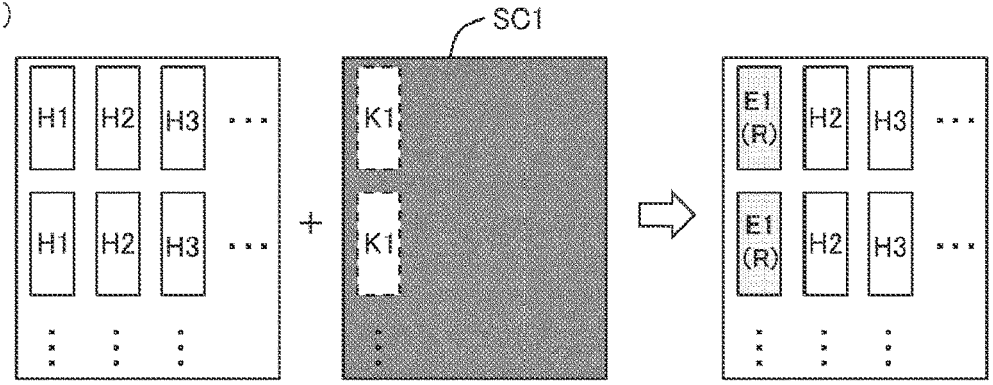
FIG. 10(a) to FIG. 10(d) are plan views illustrating the method for manufacturing the display device according to Example 1.
Figure 10:
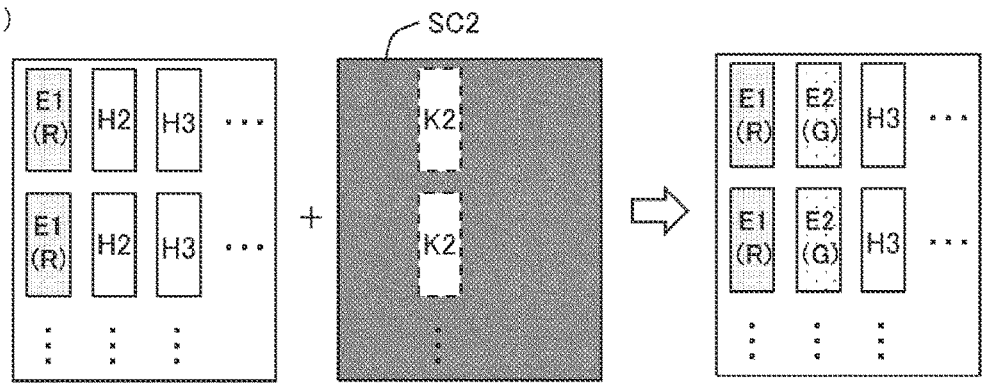
Figure 10:
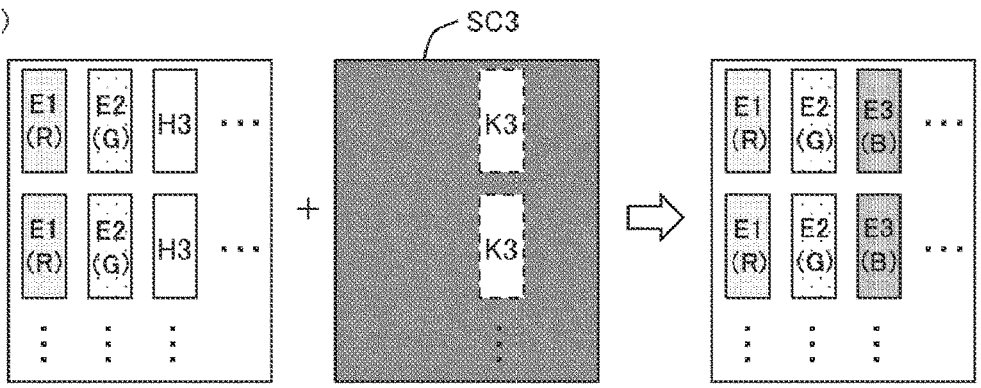
Figure 10:
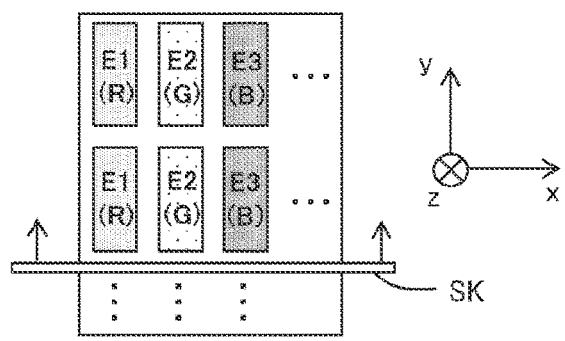

At Step S3 of FIG. 8 as illustrated in FIG. 9(c) and FIG. 10(a), the first screen SC1, which has the opening K1 to entirely overlap each first recess H1, is disposed in contact with the planarization film 23. The ink (the first light-emitting layer E1 in liquid form) containing quantum dots emitting red light is applied. At Step S4A of FIG. 8, the ink (the first light-emitting layer E1 in liquid form) is squeegeed, and the first screen SC1 is removed.

At Step S4B of FIG. 8 as illustrated in FIG. 9(d) and FIG. 10(b), a second screen SC2, which has an opening K2 to entirely overlap each second recess H2, is disposed in contact with the planarization film 23. An ink (a second light-emitting layer E2 in liquid form) containing quantum dots emitting green light is applied. At Step S4C of FIG. 8, the ink (the second light-emitting layer E2 in liquid form) is squeegeed, and the second screen SC2 is removed. Here, the second screen SC2 may be the same as the first screen SC1. After Step S4A of FIG. 8, the removed first screen SC1 may be reused.

At Step S4D of FIG. 8 as illustrated in FIG. 9(e) and FIG. 10(c), a third screen SC3, which has an opening K3 to entirely overlap each third recess H3, is disposed in contact with the planarization film 23. An ink (a third light-emitting layer E3 in liquid form) containing quantum dots emitting blue light is applied. At Step S4E of FIG. 8, the ink (the third light-emitting layer E3 in liquid form) is squeegeed, and the third screen SC3 is removed. Note that a plurality of the first light-emitting layers E1 emitting red light are arranged in the y-direction (in the column direction). A plurality of the second light-emitting layers E2 emitting green light are arranged in the y-direction. A plurality of the third light-emitting layers E3 emitting blue light are arranged in the y-direction. The first light-emitting layers E1, the second light-emitting layers E2, and the third light-emitting layers E3 are arranged in the x-direction.

At Step S5 of FIG. 8 as illustrated in FIG. 9(f) and FIG. 10(d), the squeegee SK is slid in contact with the planarization film 23 in the y-direction (in the column direction in which the light-emitting layers emitting light of the same color are arranged) to squeegee the first light-emitting layers E1, the second light-emitting layers E2, and the third light-emitting layers E3 again. As illustrated in FIG. 10(d), the squeegee SK is slid preferably in the longitudinal direction of the first, the second, and the third recesses.

Example 1 makes it possible to efficiently manufacture the display device including the first light-emitting layers E1 emitting red light, the second light-emitting layers E2 emitting green light, and the third light-emitting layers E3 emitting blue light, while the film thicknesses of the light-emitting layers are controlled.

FIG. 11(a) to FIG. 11(d) are cross-sectional views of the display device manufactured by the manufacturing method according to Example 1. In Example 1, the upper functional layer 24, the upper electrode 25, and the sealing layer 6 are formed in common between, and above, the first light-emitting layer E1 included in a sub-pixel SP1 and emitting red light, the second light-emitting layer E2 included in a sub-pixel SP2 and emitting green light, and the third light-emitting layer E3 included in a sub-pixel SP3 and emitting blue light.

Movement of the electrons decreases in the order of the first light-emitting layer E1 emitting red light, the second light-emitting layer E2 emitting green light, and the third light-emitting layer E3 emitting blue light. Hence, the thickness of each light-emitting layer may be increased in the stated order, such that distribution of the carriers can be improved in the thickness direction. That is, the first light-emitting layer E1 is formed thicker than the second light-emitting layer E2, and the second light-emitting layer E2 is formed thicker than the third light-emitting layer E3.

Figure 11:
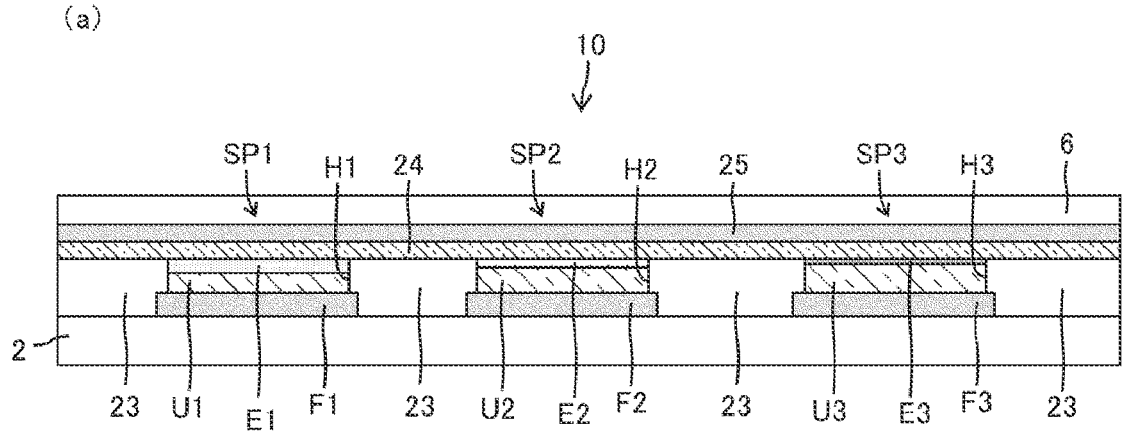
FIG. 11(a) and FIG. 11(b) are cross-sectional views of the display device according to Example 1.
Figure 11:
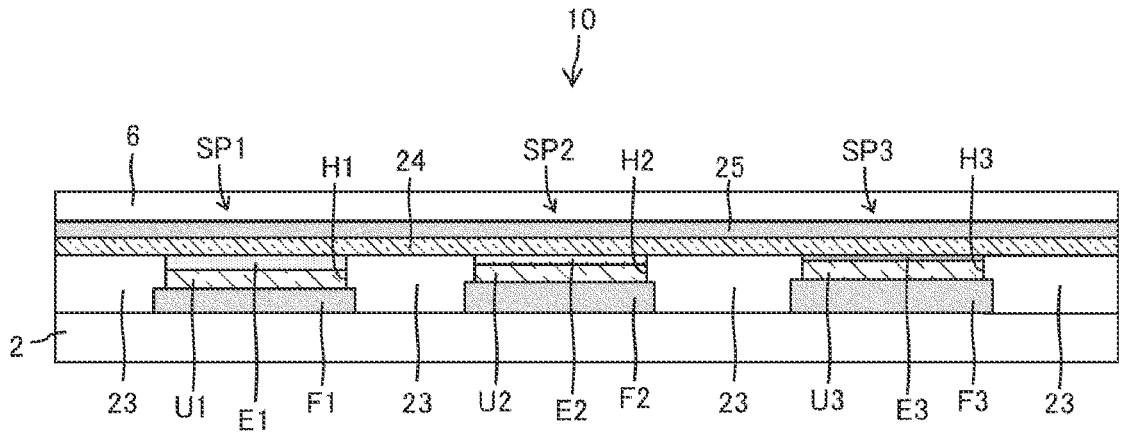

As a result, in the display device 10 illustrated in FIG. 11(a), movement of the electrons in the red light-emitting layer E1 decreases most. Accordingly, the first lower functional layer U1 is formed preferably thinner than at least one of the second lower functional layer U2 or the third lower functional layer U3. Moreover, the first recess H1, the second recess H2, and the third recess H3 are formed to have a uniform depth. The first lower functional layer U1 is formed thinner than the second lower functional layer U2. The second lower functional layer U2 is formed thinner than the third lower functional layer U3. Thanks to such features, the light-emitting layers are thicker in the order of the first light-emitting layer E1 (e.g. 40 nm), the second light-emitting layer E2 (e.g. 30 nm), and the third light-emitting layer E3 (e.g. 20 nm).

In the display device 10 illustrated in FIG. 11(b) according to another embodiment, the first recess H1 is formed preferably deeper than at least one of the second recess H2 or the third recess H3. Moreover, the first recess H1 is formed preferably deeper than the second recess H2, and the second recess H2 is formed preferably deeper than the third recess H3. Furthermore, the first lower functional layer U1, the second lower functional layer U2, and the third lower functional layer U3 are formed to have a uniform thickness. Thanks to such a feature, the light-emitting layers are thicker in the order of the first light-emitting layer E1, the second light-emitting layer E2, and the third light-emitting layer E3.

Figure 12:
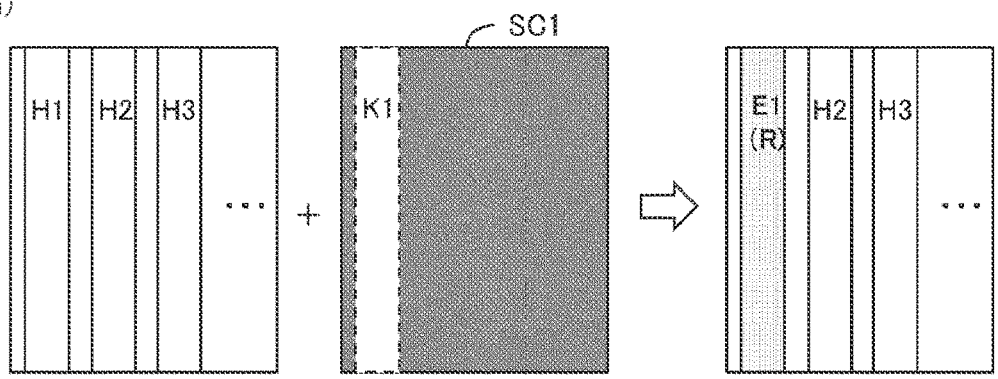
FIG. 12(a) to FIG. 12(d) are cross-sectional views illustrating a modification of Example 1.
Figure 12:
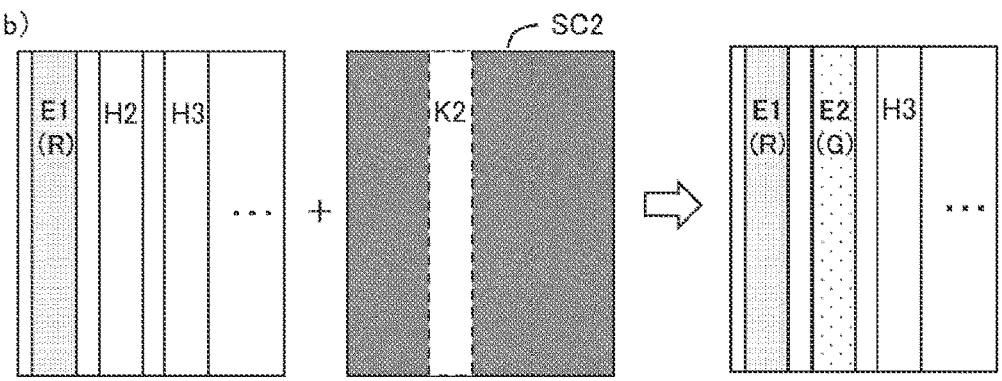
Figure 12:
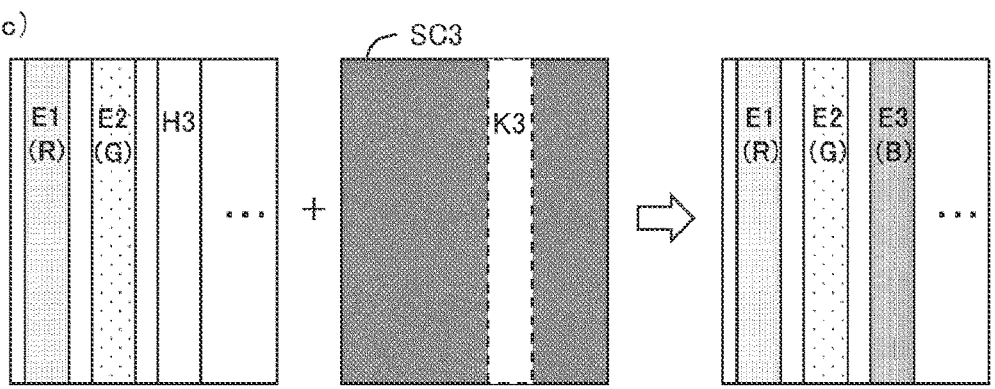
Figure 12:
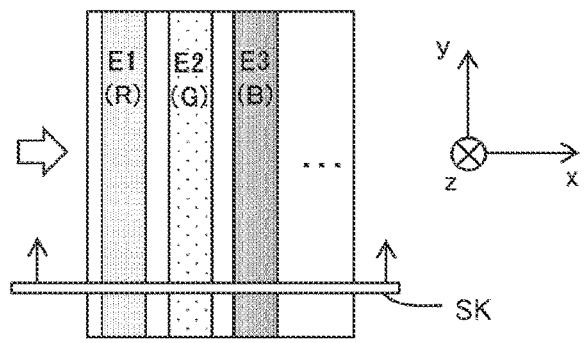

FIG. 12(a) to FIG. 12(d) are cross-sectional views illustrating a modification of Example 1. In this modification, the first recess H1, the second recess H2 and the third recess H3 are formed linearly in plan view (formed to extend in the y-direction), and arranged in the x-direction (in the row direction). In FIG. 12(a), an ink (the first light-emitting layer E1 in liquid form) containing red-light-emitting quantum dots is applied, using the first screen SC1 that has the opening K1 to entirely overlap the first recess H1. The applied first light-emitting layer E1 is squeegeed. In FIG. 12(b), an ink (the second light-emitting layer E2 in liquid form) containing green-light-emitting quantum dots is applied, using the second screen SC2 that has the opening K2 to entirely overlap the second recess H2. The applied second light-emitting layer E2 is squeegeed. In FIG. 12(c), an ink (the third light-emitting layer E3 in liquid form) containing blue-light-emitting quantum dots is applied, using the third screen SC3 that has the opening K3 to entirely overlap the third recess H3. The applied third light-emitting layer E3 is squeegeed.

In FIG. 12(d), the squeegee SK is slid in the y-direction (in the direction to which the light-emitting layers extend) without a screen to squeegee the first light-emitting layer E1, the second light-emitting layer E2, and the third light-emitting layer E3 again.

EXAMPLE 2

Figure 13:
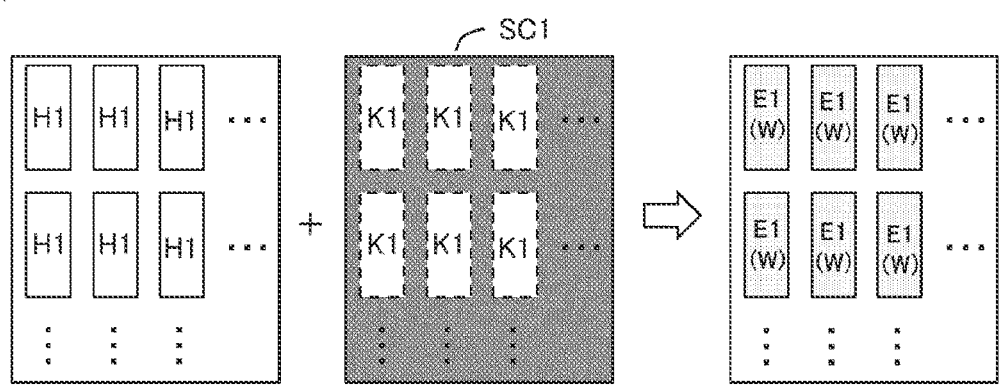
FIG. 13(a) and FIG. 13(b) are plan views illustrating a method for manufacturing the display device according to Example 2.
Figure 13:
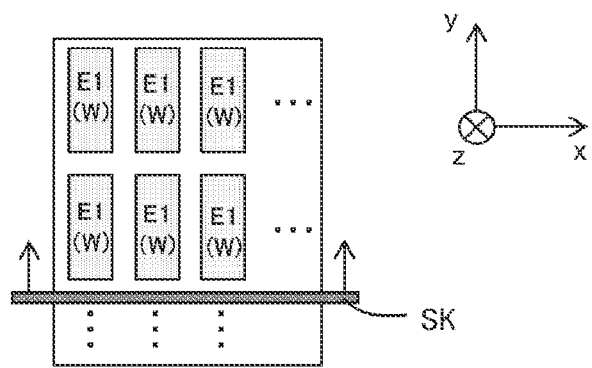

FIG. 13(a) to FIG. 13(d) are cross-sectional views illustrating a method for manufacturing the display device according to Example 2. In Example 2, a plurality of the first recesses H1 are formed in a matrix. In FIG. 13(a), applied is an ink (the first light-emitting layer E1 in liquid form for emitting white light) containing red-light-emitting quantum dots, green-light-emitting quantum dots, and blue-light-emitting quantum dots, using the first screen SC1 that has the opening K1 to entirely overlap each first recess H1. The applied first light-emitting layer E1 is squeegeed. In FIG. 13(b), the squeegee SK is slid either in the y-direction or in the x-direction without a screen to squeegee the first light-emitting layer E1 again. After the squeegeeing in Example 2, as can be seen in Example 1, the upper functional layer 24 and the upper electrode 25 are formed, and a color conversion layer emitting light of one of R, G, and B is provided for each of the sub-pixels. Such features make it possible to present an image with color.

The above embodiments are intended for exemplification and description, and not for limitation, of the disclosure. It is apparent for those skilled in the art that many modifications are available in accordance with the exemplification and description.

The invention claimed is:

1. A display device including a plurality of light-emitting elements, the display device comprising:
a first lower electrode;
a planarization film formed above the first lower electrode;
a first recess formed in the planarization film, and overlapping the first lower electrode; and
a first lower functional layer and a first light-emitting layer stacked together in the first recess, the first light-emitting layer containing first quantum dots, wherein:
an upper face of the planarization film is flush with an upper face of the first light-emitting layer, and
in a plan view, an outer edge of the first lower functional layer, an outer edge of the first light-emitting layer, and an outer edge of the first recess match with one another.

2. The display device according to claim 1, further comprising:
a second recess and a third recess formed in the planarization film, the second recess overlapping a second lower electrode, and the third recess overlapping a third lower electrode;
a second lower functional layer and a second light-emitting layer stacked together in the second recess, the second light-emitting layer containing second quantum dots; and
a third lower functional layer and a third light-emitting layer stacked together in the third recess, the third light-emitting layer containing third quantum dots, wherein
an upper face of the planarization film is flush with an upper face of the second light-emitting layer and an upper face of the third light-emitting layer.

3. The display device according to claim 2, wherein the first quantum dots emit red light, the second quantum dots emit green light, and the third quantum dots emit blue light.

4. The display device according to claim 2, wherein the third recess is shallower than at least one of the first recess or the second recess.

5. The display device according to claim 2, wherein the third light-emitting layer is thinner than at least one of the first light-emitting layer or the second light-emitting layer.

6. A display device including a plurality of light-emitting elements, the display device comprising:
a first lower electrode;
a planarization film formed above the first lower electrode;
a first recess formed in the planarization film, and overlapping the first lower electrode; and
a first lower functional layer and a first light-emitting layer stacked together in the first recess, the first light-emitting layer containing first quantum dots;
a second recess and a third recess formed in the planarization film, the second recess overlapping a second lower electrode, and the third recess overlapping a third lower electrode;
a second lower functional layer and a second light-emitting layer stacked together in the second recess, the second light-emitting layer containing second quantum dots; and
a third lower functional layer and a third light-emitting layer stacked together in the third recess, the third light-emitting layer containing third quantum dots, wherein:
an upper face of the planarization film is flush with an upper face of the first light-emitting layer, an upper face of the second light-emitting layer, and an upper face of the third light-emitting layer,
the first quantum dots emit red light, the second quantum dots emit green light, and the third quantum dots emit blue light, and the third recess is shallower than at least one of the first recess or the second recess.

7. The display device according to claim 6, wherein
a peripheral end portion of the first lower electrode is covered with the planarization film, and
a non-peripheral end portion of the first lower electrode is in contact with the first lower functional layer.

8. A display device including a plurality of light-emitting elements, the display device comprising:
   a first lower electrode;
   a planarization film formed above the first lower electrode;
   a first recess formed in the planarization film, and overlapping the first lower electrode; and
   a first lower functional layer and a first light-emitting layer stacked together in the first recess, the first light-emitting layer containing first quantum dots;
   a second recess and a third recess formed in the planarization film, the second recess overlapping a second lower electrode, and the third recess overlapping a third lower electrode;
   a second lower functional layer and a second light-emitting layer stacked together in the second recess, the second light-emitting layer containing second quantum dots; and
   a third lower functional layer and a third light-emitting layer stacked together in the third recess, the third light-emitting layer containing third quantum dots, wherein:
      an upper face of the planarization film is flush with an upper face of the first light-emitting layer, an upper face of the second light-emitting layer and an upper face of the third light-emitting layer,
      the first quantum dots emit red light, the second quantum dots emit green light, and the third quantum dots emit blue light, and
      the third light-emitting layer is thinner than at least one of the first light-emitting layer or the second light-emitting layer.

9. The display device according to claim 8, wherein
a peripheral end portion of the first lower electrode is covered with the planarization film, and
a non-peripheral end portion of the first lower electrode is in contact with the first lower functional layer.

* * * * *